Figure 1:
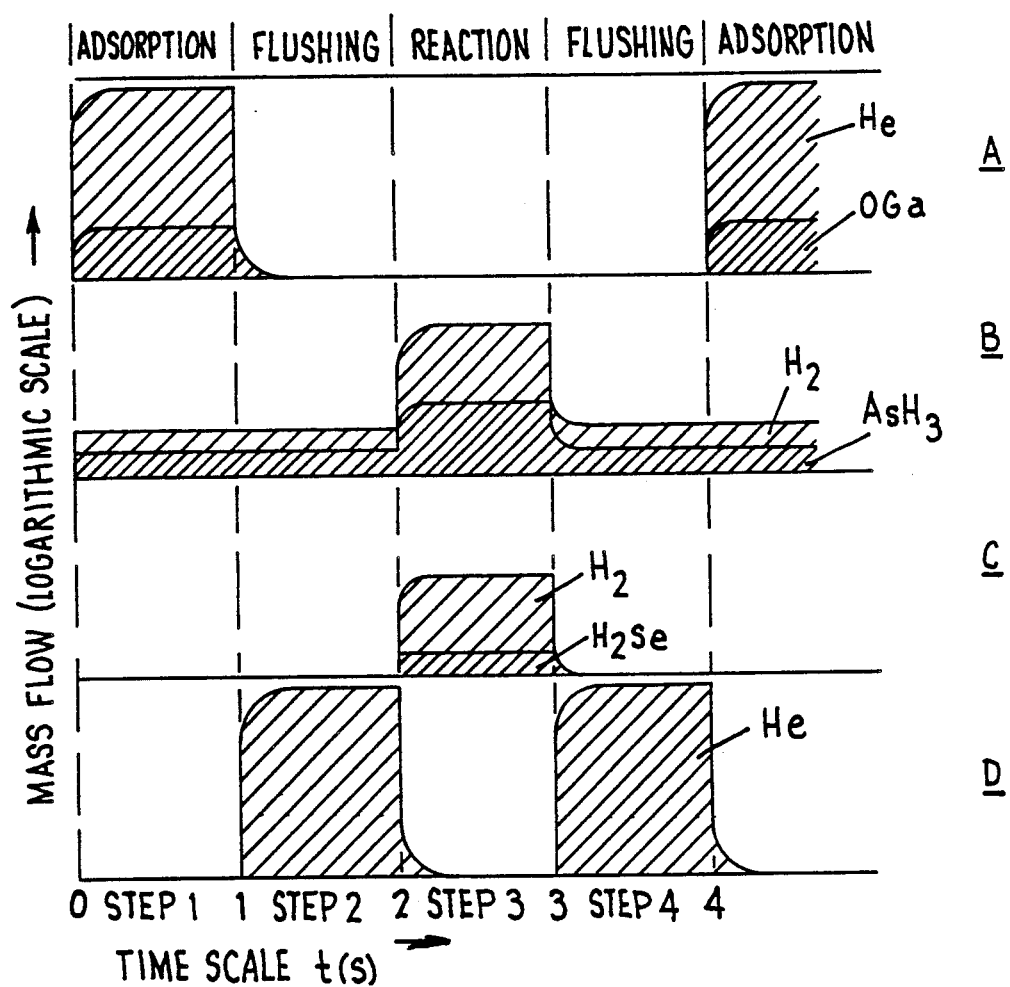

United States Patent [19]

Scholz

[11] Patent Number: 4,993,357

[45] Date of Patent: Feb. 19, 1991

[54] APPARATUS FOR ATOMIC LAYER EPITAXIAL GROWTH

[75] Inventor: Christoph Scholz, Schliersee, Fed. Rep. of Germany

[73] Assignee: CS Halbleiter -und Solartechnologie GmbH, Munich, Fed. Rep. of Germany

[21] Appl. No.: 287,903

[22] Filed: Dec. 21, 1989

[30] Foreign Application Priority Data

Dec. 23, 1987 [DE] Fed. Rep. of Germany ....... 3743938

[51] Int. Cl.$^5$ ............................................. C23C 16/00
[52] U.S. Cl. ................................... 118/715; 118/725; 118/730; 156/610
[58] Field of Search ............... 118/715, 725, 730; 156/345, 610; 204/298 C, 298 E, 298 WH

[56] References Cited

U.S. PATENT DOCUMENTS 4,058,430 11/1977 Suntola et al. ................... 156/611
4,558,660 12/1985 Nishizawa et al. ............... 118/725
4,806,321 2/1989 Nishizawa et al. ............... 118/725

FOREIGN PATENT DOCUMENTS 58-28827 2/1983 Japan ................................ 118/715
59-23513 2/1984 Japan ................................ 118/730
62-158877 7/1987 Japan ................................ 118/715
62-238365 10/1987 Japan ................................ 118/715

Primary Examiner—Norman Morgenstern
Assistant Examiner—Terry J. Owens
Attorney, Agent, or Firm—Flynn, Thiel, Boutell & Tanis

[57] ABSTRACT

An apparatus for carrying out atomic layer epitaxial growth of a thin semiconductor layer on a substrate surface has a cylindrical chamber in which a substrate holder is coaxially mounted so as to define an annular gap therebetween. The substrate holder can be in the form of a rotatable turbine wheel and a funnel-shaped hood introduces a reactant gas onto the substrate at an oblique angle.

10 Claims, 2 Drawing Sheets

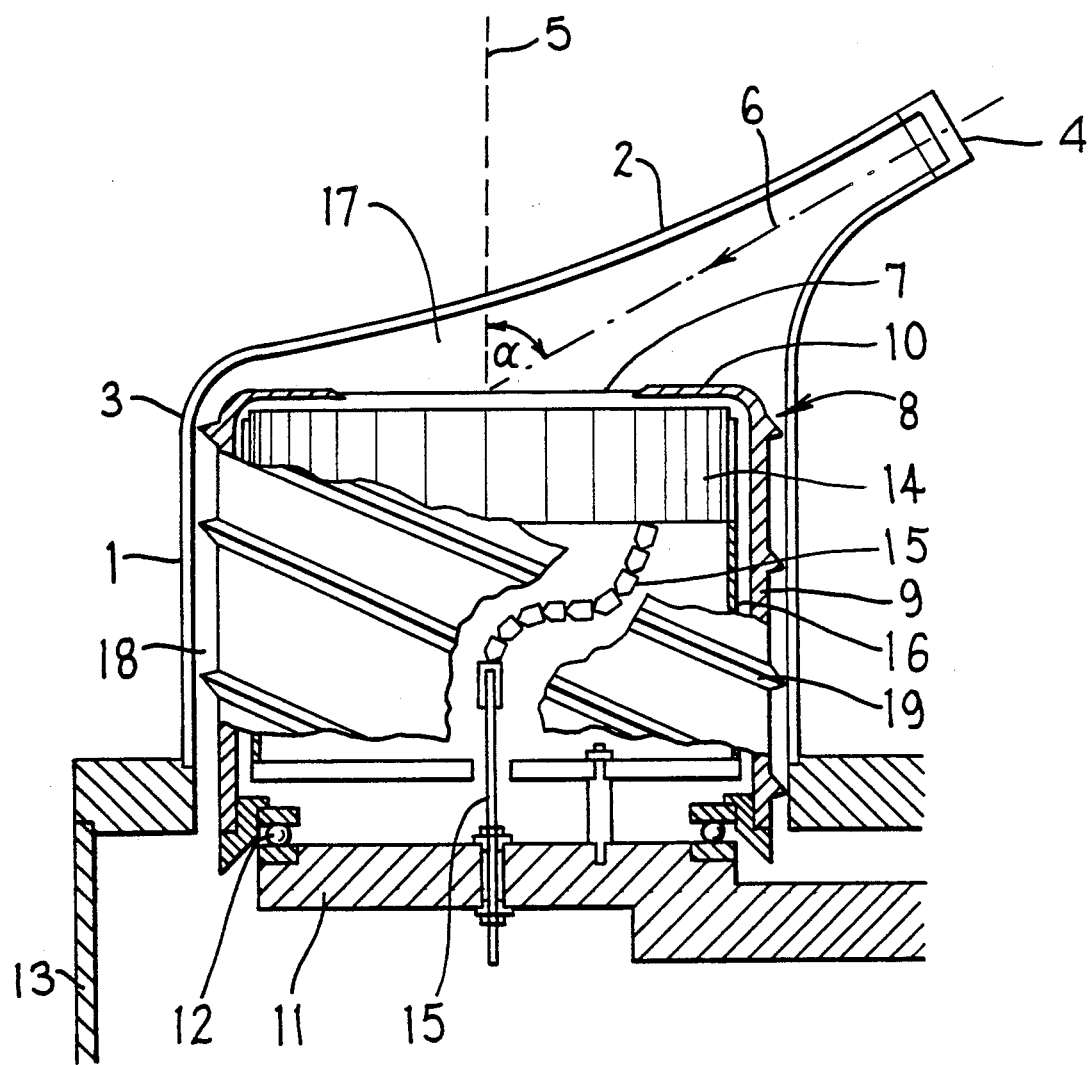

APPARATUS FOR ATOMIC LAYER EPITAXIAL GROWTH

The invention relates to a process for atomic layer epitaxial growth of a thin semiconductor layer on a substrate surface, in which gaseous compounds of the element or elements of the semiconductor, alternating with a hydrogen-containing carrier gas, are supplied to a chamber which accommodates the heated substrate. The subject matter of the present invention is also directed to an apparatus which is suitable for carrying out said process.

In order to prepare an epitaxial, i.e. crystallo-graphically oriented monocrystalline semiconductor, for example, from the elements A and B, the atomic layer epitaxial process is used. In this process, a compound of the element A is first supplied to the heated substrate until the substrate surface is covered with a monomolecular layer or A monolayer, and then the compound of the element B is supplied in order to react with the A monolayer to form an AB monolayer. This cycle is repeated until the required layer thickness is reached. In this context, the element A may be an element of group II of the periodic system and the element B an element of the group VI of the periodic system (II/VI-compound semiconductor) or an element of group III, such as aluminum, gallium or indium, and an element of group V, for example nitrogen, phosphorus, arsenic or antimony (III/V-compound semiconductor). If a IV-/IV-compound semiconductor is to be prepared, the element may be silicon, germanium or carbon (for example, SI—Si, Si—Ge, Si—C or Ge—Ge semiconductor). The compounds of A and B are supplied in a carrier gas.

In atomic layer epitaxial growth of gallium arsenide from an organometallic gallium compound, for example triethylgallium (TEG), and arsine ($AsH_3$) it has been found that the layer formed has a high p-type conductivity and low electron mobility. This is attributable to the fact that, during the adsorption of the gallium compound, arsenic evaporates from the surface and results in vacancies. In order to counteract the evaporation of arsenic from the semiconductor surface, it has been proposed that, during the supply of the TEG, a small amount of arsine is added to the carrier gas (Japanese Journal of Applied Physics, Vol. 24, No. 12, December 1985, Pages L 926 to L 964; Inst. Phys. Conf., Ser. No. 83, Ch. 1, Intern. Symp. GaAs and Related Compounds, 1986, Pages 1 to 8, Jap. J. of Appl. Phys., Vol. 25, No. 6, 1986, Pages L 513 to L 515). In this case hydrogen is used as carrier gas.

Although this somewhat reduces the p-type conductivity and increases the electron mobility slightly, a process which is already unavoidable in the case of normal atomic layer epitaxial growth, that is to say, when, for example, pure arsine and TEG are alternately supplied to the chamber, becomes even more of a problem. The fact is that, as a result of the residues of one gaseous compound, that is to say, for example, of the arsine, in the chamber, when the other gaseous compound, that is to say, for example, TEG, is supplied, a reaction of the two compounds in the gas phase occurs and, consequently, adduct formation, nucleation and deposits on the inside wall of the chamber and the like occur, which drastically impairs the properties of the thin semiconductor layer. However, the addition of arsine when the TEG is being supplied, as is proposed in these literature sources, further promotes these gas phase reactions substantially.

At the same time, as a very toxic gas, arsine is subject to strict legal requirements. In the known process, however, substantially more arsine is used as a result of the continuous supply of arsine than is consumed to form the semiconductor so that considerable arsine disposal problems arise.

In order to restrain the formation of crystal nuclei in the atomic layer epitaxial process, according to European Patent Specification No. 0,015,390, an inert flushing gas, for example, argon, is supplied between the alternating supply of compounds of the elements of the semiconductor in order to prevent any contact of the compounds with each other and, consequently, adduct formation and nucleation. However, the semiconductor layer prepared by this process is notable for an undesirably high p-type conductivity and low electron mobility.

According to the prior art, two types of apparatus are used to prepare thin semiconductor layers by atomic layer epitaxial growth, namely the vertical reactor and the horizontal reactor.

While the substrate on which the thin semiconductor layer grows is arranged in a radial plane of the cylindrical reactor chamber, i.e. perpendicular to the cylinder axis of the reactor or to the gas flow direction in the case of the vertical reactor, in the horizontal reactor, the substrate extends in the longitudinal direction of the reactor, that is to say in the gas flow direction.

However, both types of reactor do not meet the highest requirements. In particular, they do not permit the necessary uniformity of the coating in relation to layer thickness and composition.

Thus, in the horizontal reactor, the gas first impinges on the region of the substrate facing the gas inlet so that the layer thickness of the thin semiconductor layer is greatest at that point and decreases in the flow direction of the gas, and the composition may change correspondingly. The reason for this is also because of gas turbulence in the region of the substrate facing the inlet.

In the vertical reactor, the gas is supplied to the cylindrical chamber via a funnel at whose vertex, which lies on the cylinder axis of the chamber, the gas inlet is arranged. The main flow direction of the gas consequently runs along the cylinder axis of the chamber and, after the gas impinges on the substrate, in the radial direction. The coating consequently becomes thicker in the centre of the substrate than at the edge and a change in composition may also occur from the centre of the substrate to the edges. Although this non-uniformity can be reduced somewhat by a long funnel with a sharp funnel angle, this increases the volume of gas in the chamber, that is to say, makes it more difficult, in particular, to change the gas. The problems which have been mentioned, of disposing of the usually toxic gaseous compounds of the elements of the semiconductor, for example, of arsine, are also made more difficult and adduct formation and nucleation are promoted.

The object of the invention is to perceptibly reduce the quantity of toxic gases, such as arsine, to be disposed of in a process of the type mentioned above, in particular, while increasing the quality of the semiconductor layer, i.e. in particular, while reducing the evaporation of elements, such as arsenic, from the semiconductor surface, and also without adduct formation and nucleation as a result of gas phase reaction of the compounds, that is to say, specifically, for example, of TEG and arsine in the gas phase.

According to the invention, therefore, a mixture of hydrogen and noble gas is used as the carrier gas.

Furthermore, to prevent adduct formation and nucleation in the process according to the invention, the chamber is always evacuated or flushed with a flushing gas preferably between the alternating supply of the compounds. In this context, a noble gas is also expediently used as the flushing gas.

As has emerged, the use of hydrogen as a carrier or flushing gas according to the prior art has in fact the result that elements are extracted from the semiconductor surface, that is to say are etched out to a certain extent. As it has been possible to establish, the formation of the hydrides of at least some of these elements proceeds, in fact, highly exothermally. Thus, calculations have revealed that the enthalpy of the formation of arsine as a result of reaction of GaAs with $H_2$ is approx. $-85$ kJ/mol at 800 k.

In the process according to the invention, however, not all the hydrogen needs to be replaced by a noble gas. On the contrary, the advantages according to the invention already become perceptible if only a portion of the carrier or flushing gas is composed of a noble gas. In general, the proportion of noble gas in the carrier gas or flushing gas is, however, more than 50% by volume, particularly preferably, more than 80% by volume. That is to say, the hydrogen content of the carrier gas and the flushing gas is in general less than 50% by volume, preferably less than 20% by volume.

A certain hydrogen content of, for example, at least 5% by volume in the carrier or flushing gas is, however, preferred, because this ensures a reducing atmosphere which prevents contaminations which are caused by oxidation.

If methyl compounds are used as gaseous compounds of the elements (for example, the dimethyl chloride or the trimethyl compound of gallium, aluminum or indium), a certain proportion of hydrogen may also be advantageous because it reduces the decomposition temperature of such organometallic methyl compounds.

Advantageously, those compounds of A and B which have the higher vapour pressure are added in a certain proportion during all the cycles of the epitaxial growth, that is to say, both while flushing with the flushing gas and while supplying the other compound with the lower vapour pressure. The quantity of the compound with the higher vapour pressure in the flushing gas or in the other compound while it is being supplied is preferably so adjusted that it produces a vapour pressure of the respective element which corresponds as far as possible to the vapour pressure of said element above the heated semiconductor layer.

According to the invention, instead of supplying a flushing gas, the chamber may also be evacuated between the supplying of the compound of the element or elements. Furthermore, a small quantity of the compound with the higher vapour pressure (without flushing gas) may also be supplied during the evacuation step.

During the preparation of a gallium arsenide (GaAs) semiconductor by the process according to the invention no nucleation whatsoever can be observed. This is a completely surprising result in view of the prior art described above. Above all, however, the p-type conductivity is drastically repressed and a surprisingly high electron mobility is achieved.

If a GaAs semiconductor is to be prepared according to the invention from arsine and an organometallic gallium compound, the vapour pressure of the $As_2$ molecules is about $10^{-5}$ Pa above the GaAs layer for a substrate temperature of approx. 600° C. Accordingly, when flushing gas is being supplied and when gaseous organometallic gallium compounds are being supplied, arsine is added in a quantity such that an $As_2$ pressure of at least about $10^{-5}$ Pa at 600° C. would be established in the gas mixture supplied.

Gallium-aluminum-arsenide semiconductors of the formula $Ga_{1-x}Al_xAs$, where x may be $=0$ to 1, that is to say, where a gallium arsenide or an aluminum arsenide semiconductor layer may be involved, can be advantageously formed by the process according to the invention. In this case, alternating layers of several monolayers of GaAs and several monolayers of GaAlAs are preferably allowed to grow, i.e. a heterostructure is formed, so that a two-dimensional electron gas develops at the phase boundary between the layers.

In the same way, an indium-gallium-arsenide-phosphide semiconductor of the formula $In_{1-x}Ga_xAs_{1-y}P_y$, that is to say a quaternary system, where x can be$=0$ to 1 and y can be$=0$ to 1, can be prepared in an advantageous manner according to the invention so that, for example, with $x=0$ and $y=1$ an indium phosphide layer is formed or with $x=0.5$ and $y=0$ an InGaAs layer is formed. As a result of developing a heterostructure by layer-wise growth of alternating layers with different x and/or y, two-dimensional electron gas structures can again be obtained at the phase boundary of the layers, an optimum matching of the lattice constants to each other being possible in the heteroepitaxy of different compounds in such a quaternary system.

In the preparation of a GaAlAs or InGaAsP semiconductor with a substrate temperature between 300° and 1000° C., the quantity or the mass flow of arsine or phosphine respectively in the flushing gas and while the organometallic gallium, aluminum or indium compound is being supplied is, in general, at most 8% and preferably less than 4% of the maximum arsine or phosphine mass flow, i.e. of the arsine or phosphine mass flow in those steps in which an As or P monolayer is formed in each case.

The mass flow of the arsine or phosphine when the flushing gas is being supplied and when the organometallic compound is being supplied takes place preferably under computer control as a function of the arsenic or phosphorus vapour pressure over the semiconductor at the particular substrate temperature.

That is to say, according to the invention it is indeed an advantage to add a certain quantity of arsine or phosphine while the organometallic compound of the other element is being supplied and also, optionally, to the carrier gas or flushing gas during the flushing step.

The quantity of arsine or phosphine added is, however, always markedly less than according to the known process. At the same time it should be borne in mind that as a result of the low proportion of hydrogen in the carrier or flushing gas, any extraction of arsenic or phosphorus from the semiconductor surface to form arsine or phosphine is largely prevented by the process according to the invention. That is to say, the process according to the invention markedly reduces the problems of arsine or phosphorus disposal.

Dimethyl chloride and also, in particular, diethyl chloride have proved advantageous as organometallic compounds of Ga, Al and In.

Compared with dimethyl chloride, diethyl chloride has the advantage that it decomposes at relatively low temperature with the cleavage of ethene, i.e., no hydrogen is required for the reaction. If diethyl chloride is used, the carrier gas may therefore be composed almost completely of noble gas, i.e. any etching of arsenic or phosphorus out of the surface of the semiconductor by $H_2$ is largely prevented. However, the dimethyl chloride may be more expedient if decomposition temperature of diethyl chloride is too low or the vapour pressure of the corresponding diethyl chloride is too high. In this case, the carrier gas contains, in general, sufficient hydrogen to facilitate the cleavage of the methyl radicals.

Gallium diethyl chloride (DEGaCl) should be mentioned as the preferred organometallic gallium compound in the process according to the invention. DEGaCl results, in fact, in the formation of exactly one monolayer even in the absence of $H_2$, that is to say, in pure helium, at a relatively low temperature of 350° C. and in a relatively wide temperature range of up to 600° C. and over. As a result of this, temperature control and distribution is not critical. On the contrary, as a result of the relatively low temperature of the substrate which is sufficient to form monolayers, the arsenic or phosphorus pressure respectively above the GaAs/P layer is particularly low so that no arsenic or phosphorus evaporates from the semiconductor surface. Accordingly, it may be possible to dispense with completely, if desired, $AsH_3$ or $PH_3$ respectively when the flushing gas is being supplied and when DEGaCl is being supplied or it may be adjusted to a relatively low level, which rules out the risk of nucleation, adduct formation etc. Apart from that, the low substrate temperature has a favourable effect on avoiding interdiffusion at heterogeneous interfaces.

Dopants can be incorporated in the semiconductor layer by the process according to the invention. In this context, the dopants can be incorporated intentionally at those places in the host lattice where, depending on conductivity type (p or n), they are intended to replace particular lattice atoms as equivalents. Thus, for example, p-type dopants, such as Be, Mg or Zn can be added to the carrier gas of the element of the third main group, that is to say, for example, the organometallic gallium compound, and those of n-type, such as S, Se or even amphoterics, such as Si or Sn, can be added to the arsine or phosphine carrier gas.

An exemplary embodiment of the invention is explained in more detail below on the basis of the drawing in which FIG. 1 shows a diagram of the mass flow modulation for growing Se-doped GaAs.

In the latter, the curve A represents the mass flow diagram of a mixture of an organometallic gallium compound (OGa), for example DEGaCl, with helium (He) as carrier gas, the curve B represents the mass flow diagram of a mixture of arsine ($AsH_3$) and hydrogen ($H_2$) as carrier gas, the curve C represents the mass flow diagram of a mixture of a dopant (Do), for example $H_2Se$, and hydrogen ($H_2$) as carrier gas, and the curve D represents the mass flow diagram of the flushing gas (He).

As can be gathered from the drawing, a monolayer cycle, which is in total, for example, 4 sec, is made up of the following four steps:
1. Adsorption of the organometallic gallium compound (OGa)—1 sec;
2. Flooding with He—1 sec;
3. Reaction with $AsH_3$ (and $H_2Se$)—1 sec;
4. Flooding with He—1 sec.

As can be gathered from curve B, a small quantity of $AsH_3$ and $H_2$ is supplied not only in step 3, but also during the steps 1, 2 and 4.

Helium, which also acts as a carrier gas for the organometallic gallium compound, is used as the flushing gas.

The metered addition of the organometallic gallium compound makes use of its vapour pressure. For this purpose, helium is passed through a temperature-controlled bubble counter which contains the liquid organometallic gallium compound. Metered addition of p-type dopants may be carried out in the same manner. As an $AsH_3/H_2$ mixture for the mass flow of curve B, use can be made of a commercially available mixture of, for example, 10% by volume of $AsH_3$ in $H_2$. This mixture is supplied continuously, and in particular, with maximum mass flow in the third, $AsH_3$ reaction step, it being throttled at other times to a value of, for example, 3% of the maximum mass flow. The helium for flushing or flooding during the second and the fourth step of each cycle originates, for example, from a suitable gas bomb.

During the atomic layer epitaxial growth, the pressure in the chamber is, according to the invention, preferably 10 to 10,000 Pa (0.1 to 100 mbar) for all steps if a flushing gas is used. If evacuation is carried out between the alternating supply of the flushing gas, the pressure is lowered by a factor of 100 to 10,000 during the evacuation step. That is to say, for example, with a chamber pressure of 100 Pa during the alternating supply of the compounds, the pressure is meanwhile reduced to, for example, 0.1 Pa during the evacuation step.

The invention also makes available an apparatus or a reactor for the preparation of thin semiconductor layers by atomic layer epitaxial growth with which thin semiconductor layers of high uniformity can be obtained. The reactor according to the invention is particularly suitable for carrying out the process according to the invention.

An embodiment of the reactor according to the invention is explained in detail below on the basis of the drawing, in which FIG. 2 shows diagrammatically a longitudinal section through the reactor. According to this, the reaction chamber is a cylinder 1 provided with a funnel-like hood 2 at its upper end, which hood tapers from its base 3, that is to say its lower end which is joined to the cylinder 1, towards its upper end at which the gas inlet 4 is situated.

At the same time, the gas inlet 4 is radially offset with respect to the cylinder axis 5 of the chamber. That is to say, the funnel axis 6 of the hood 2 forms, with the cylinder axis 5 of the chamber, an acute angle α which is larger than 0 and less than 90°, and in particular, is, in general, 20° to 70°, preferably 40° to 60°.

At the upper end of the cylinder 1, that is to say in the region of the base 3 of the funnel-like hood 2, the substrate 7, on which the thin semiconductor layer is to be formed by atomic layer epitaxial growth, is disposed in a radial plane with respect to the cylinder axis 5.

The substrate is held by a substrate holder 8. The substrate holder 8 comprises a cylindrical section 9 coaxial with the cylinder axis 5 and an annular flange 10, on which the substrate rests and which extends via a radially disposed edge inwardly towards the cylinder axis 5.

The substrate holder 8 is rotatably mounted around the cylinder axis 5 on a base plate 11. For this purpose, a rolling or ball bearing 12 is provided between the lower end of the cylindrical section 9 of the substrate holder 8 and the base plate 11.

The lower end of the reaction chamber 1 sits on a vessel 13 in which the base plate 11 is also mounted, the vessel 13 being connected to a vacuum pump which is not shown.

Disposed in the substrate holder 8 below the annular flange 10 is an electrical heating element 14 which is connected to the power supply lead 15. Provided between the heating element 14, on the one hand, and the cylindrical section 9 of the substrate holder 8 and also the base plate 11, on the other hand, is a thermal shield 16 which also serves to mount the heating element 14 on the base plate 11.

In the apparatus according to the invention, the gas flowing into the reaction chamber from the inlet 4 impinges obliquely on the substrate 7. This has the result that more intense growth than in the other substrate regions does not occur either in the centre, as in the vertical reactor, or at the edge, as in the horizontal reactor. That is to say, the apparatus according to the invention results in a uniform growth of the thin semiconductor layer in all regions.

As a result of the oblique arrangement of the funnel axis 6 with respect to the cylinder axis 5 and, consequently, to the main flow direction of the gases, the substrate 7 is in fact disposed obliquely with respect to the main flow direction of the gases. This results in a compression of the gases above the substrate 7 in the region 17 of the hood 2, which region is situated opposite the gas inlet 4, and, consequently, in a uniform depletion of the gases.

At the same time, as a result of the oblique construction of the hood 2, its internal volume and, consequently, the gas volume in the reactor are small. This has the result that the quantity of the compounds of the semiconductor elements, some of which are very toxic and which are fed alternately to the reaction chamber comprising hood 2 and cylinder 1, is relatively small and that the gas change, i.e. the extraction of the gases from the hood 2 via the annular gap 18 between the cylindrical section 9 of the holder 8 and the inside wall of the cylinder 1 of the reaction chamber can be carried out rapidly.

The annular gap 18 may also be of a relatively narrow construction. This has the result that the substrate holder 8 can be rotatably constructed as a turbine wheel, the buckets or other gas guiding elements such as vanes 19 of the turbine wheel or the substrate holder 8 being disposed in the annular gap 18.

The rotation of the substrate holder 8 and, consequently, of the substrate 7 achieves a uniform distribution of the heat delivered by the heating element 14 to the substrate 7.

As a result of the construction of the substrate holder 8 as a turbine wheel, there is no need for passages for shafts, cables and the like, which impair the vacuum in the vessel 13, or for a motor for driving the substrate holder 8 in the vessel 13 with the corresponding particle abrasion.

It is also evident that the apparatus according to the invention is aerodynamically constructed, that is to say, gas turbulence is avoided.

The inside of the hood 2 and, optionally, of the cylinder 1 of the reaction chamber is coated with silicon nitride ($Si_3N_4$). The substrate holder 8 and also, optionally, the bearing 12 and the base plate 11 may also be composed of $Si_3N_4$ ceramic or coated therewith.

As has emerged, silicon nitride has in fact a very low coefficient of adhesion for arsine, phosphine and organometallic gallium compounds, in particular DEGaCl, so that the risk that residues of arsine, phosphine or of the organometallic gallium compound, which still adhere to the substrate holder 8 even after the flushing cycle and result in the formation of deposits on the substrate holder 8 or in gas-phase reactions when the organometallic gallium compound or arsine or phosphine are subsequently being supplied, is further eliminated. For the same reason, it is advantageous to coat the inside wall of the reaction chamber, that is to say, of the hood 2 and of the cylinder 1, and also the inside wall of the gas pipelines to the reaction chamber with silicon nitride and to heat the inside wall of the reaction chamber and also the gas pipelines to the reaction chamber by means of appliances which are not shown. The heating element 14 is also preferably constructed as a graphite resistor coated with silicon nitride.

I claim:

1. An apparatus for carrying out atomic layer epitaxial growth of a thin semiconductor layer on a substrate surface by the use of reactant gases, said apparatus comprising a cylindrical chamber having an upper and a lower end and a vertically disposed axis; a substrate holder coaxially mounted within said cylindrical chamber so as to define an annular gap therebetween, said substrate holder comprising means for supporting a substrate in a plane located at a central portion of said cylindrical chamber upper end and disposed perpendicular to said cylindrical chamber vertical axis; a reactant gas inlet positioned above said substrate holder; and a funnel-shaped hood connecting said reactant gas inlet with said cylindrical chamber upper end, said funnel-shaped hood having a base portion attached to said cylindrical chamber upper end and tapering upwardly toward an upper end thereof provided at said reactant gas inlet, said funnel-shaped hood additionally having a lengthwise disposed axis that forms an acute angle with said cylindrical chamber vertical axis.

2. The apparatus as claimed in claim 1, in which a heating element is provided underneath said cylindrical chamber upper end central portion.

3. The apparatus as claimed in claim 1, in which said means for supporting a substrate comprises an annular flange which supports said substrate circumferentially.

4. The apparatus as claimed in claim 1, wherein the acute angle is 20° to 70°.

5. The apparatus as claimed in claim 1, wherein the substrate holder is rotatably mounted around the cylindrical chamber vertical axis.

6. The apparatus as claimed in claim 1, wherein one or more members selected from the group consisting of the inside of the hood, the inside of the cylindrical chamber and the inside of the substrate holder are coated with silicon nitride.

7. An apparatus for carrying out atomic layer epitaxial growth of a thin semiconductor layer on a substrate surface by the use of reactant gases, said apparatus comprising a cylindrical chamber having an upper and a lower end and a vertically disposed axis; a substrate holder coaxially and rotatably mounted within said cylindrical chamber so as to define an annular gap therebetween, said substrate holder having means for causing rotation provided on an outside surface thereof and being caused to rotate by gas flowing through the annular gap between the substrate holder and the cylindrical chamber, said substrate holder additionally comprising means for supporting a substrate in a plane located at a central portion of said cylindrical chamber upper end and disposed perpendicular to said cylindrical chamber vertical axis; a reactant gas inlet positioned above said substrate holder; and a funnel-shaped hood connecting said reactant gas inlet with said cylindrical chamber upper end, said funnel-shaped hood having a base portion attached to said cylindrical chamber upper end and tapering upwardly towards an upper end thereof provided at said reactant gas inlet, said funnel-shaped hood additionally having a lengthwise disposed axis that forms an acute angle with said cylindrical chamber vertical axis.

8. The apparatus as claimed in claim 7, in which said means for causing rotation are vanes.

9. The apparatus as claimed in claim 7, in which a heating element is provided underneath said cylindrical chamber upper end portion.

10. The apparatus as claimed in claim 7, in which said means for supporting a substrate comprises an annular flange which supports said substrate circumferentially.

* * * * *

UNITED STATES PATENT AND TRADEMARK OFFICE
CERTIFICATE OF CORRECTION

PATENT NO. : 4 993 357
DATED : February 19, 1991
INVENTOR(S) : Christoph Scholz

It is certified that error appears in the above-identified patent and that said Letters Patent is hereby corrected as shown below:

On the title page of the patent, the filing date should be corrected to read as follows:

---December 21, 1988---.

Signed and Sealed this

Twenty-second Day of December, 1992

Attest:

DOUGLAS B. COMER

Attesting Officer     Acting Commissioner of Patents and Trademarks